(12) United States Patent
Mallikarjunaswamy

(10) Patent No.: US 8,791,723 B2
(45) Date of Patent: Jul. 29, 2014

(54) THREE-DIMENSIONAL HIGH VOLTAGE GATE DRIVER INTEGRATED CIRCUIT

(75) Inventor: Shekar Mallikarjunaswamy, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 57 days.

(21) Appl. No.: 13/588,429

(22) Filed: Aug. 17, 2012

(65) Prior Publication Data

US 2014/0049293 A1  Feb. 20, 2014

(51) Int. Cl.
  *H01L 21/98* (2006.01)
  *H03K 3/353* (2006.01)
(52) U.S. Cl.
  USPC .................. 327/108; 438/109; 257/E21.705
(58) Field of Classification Search
  None
  See application file for complete search history.

(56) References Cited

U.S. PATENT DOCUMENTS

| | | | |
|---|---|---|---|
| 7,110,282 B2 * | 9/2006 | Kono et al. | 365/149 |
| 7,746,125 B2 | 6/2010 | Storms et al. | |
| 2008/0074165 A1 | 3/2008 | Jeon et al. | |
| 2009/0115018 A1 * | 5/2009 | Mallikarjunaswamy | 257/517 |

OTHER PUBLICATIONS

International Rectifier High and Low Side Driver Data Sheet IRS2101(S)PbF, Nov. 27, 2006.
Fairchild FAN7382 High- and Low-Side Gate DRiver Data Sheet, 2005.
International Rectifier Application Note AN-978, "HV Floating MOS-Gate Driver ICs," Mar. 23, 2007.

* cited by examiner

*Primary Examiner* — Seahvosh Nikmanesh
(74) *Attorney, Agent, or Firm* — Van Pelt, Yi & James LLP

(57) ABSTRACT

A three-dimensional (3D) gate driver integrated circuit includes a high-side integrated circuit stacked on a low-side integrated circuit where the high-side integrated circuit and the low-side integrated circuit are interconnected using through-silicon vias (TSV). As thus formed, the high-side integrated circuit and the low-side integrated circuit can be formed without termination regions and without buried layers. The 3D gate driver integrated circuit improves ease of high voltage integration and improves the ruggedness and reliability of the gate driver integrated circuit.

15 Claims, 10 Drawing Sheets

THREE-DIMENSIONAL HIGH VOLTAGE GATE DRIVER INTEGRATED CIRCUIT

FIELD OF THE INVENTION

The invention relates to high voltage gate driver integrated circuits and, in particular, to a high voltage gate driver integrated circuit that is three-dimensional.

DESCRIPTION OF THE RELATED ART

Gate driver circuits, including high-side and low-side drivers, are used to drive power MOSFET or IGBT output transistors which are often applied in high voltage applications, such as motors. In some applications, the high-side driver is used to drive an N-channel power MOSFET in the high-side configuration which operates up to 600V. Conventional high voltage gate driver circuits integrate both the high-side gate driver and the low-side gate driver onto the same integrated circuit. FIG. 1 is a top view of a conventional high voltage gate driver integrated circuit and FIG. 2 is a cross-sectional view of the conventional high voltage gate driver integrated circuit of FIG. 1. Referring to FIGS. 1 and 2, a high voltage gate driver integrated circuit 10 typically includes a low voltage circuit region 12 and a high voltage circuit region 14 inside a high voltage floating tub. In the present description, the term "high voltage circuit region" refers to a circuit region of low voltage circuits that are sitting inside a high voltage floating tub. A junction termination region 16 is disposed between the low voltage region 12 and the high voltage floating tub. One or more N-type lateral double-diffused MOS (LDMOS) transistors 18 are disposed in the low voltage region 12 for shifting a signal voltage referenced to ground to a signal voltage referenced to the high voltage floating tub.

The junction termination region 16 provides an electrical isolation between the low voltage circuit region 12 and the high voltage circuit region 14. In some applications, the junction termination region 16 may include isolation structures and a reduced surface field (RESURF) structure. The junction termination region 16 must have enough width to ensure high reliability of the high voltage gate driver integrated circuit 10. In particular, the junction termination region 16 must have a relatively large width in order to ensure a breakdown voltage of about 600V or more and prevent malfunction of the high voltage gate driver integrated circuit 10 due to punch-through effect resulting from the formation of a depletion region. Therefore, the conventional high voltage gate driver integrated circuit 10 is relatively large in size. Some conventional high voltage gate driver circuits utilize a merged LDMOS transistor, as shown by the dotted line in FIG. 1, to reduce the size of the integrated circuit. However, the size of the junction termination region 16 is not reduced and the integrated circuit size remains large.

The high voltage gate driver integrated circuit 10 also employs N-type buried layer structure 19 formed between the P-type substrate 17 and the N-type epitaxial layer 20. The N-type buried layer 19 (NBL) is formed in both the high voltage circuit region 14 and the low voltage circuit region 12 to provide a low resistance path for parasitic substrate conduction to prevent latch-up. Buried layers require additional processing steps in the fabrication of the high voltage gate driver integrated circuit and thus increase the cost of manufacturing.

SUMMARY OF THE INVENTION

According to one embodiment of the present invention, a three-dimensional gate driver integrated circuit includes a low-side integrated circuit having formed thereon a low-side driver and a first LDMOS transistor where the low-side integrated circuit receives a low-side input signal and a high-side input signal and provides a low-side output signal; a high-side integrated circuit having formed thereon a high-side driver, a first resistor, and a latch circuit, the high-side integrated circuit providing a high-side output signal; a high voltage passivation layer formed between the low-side integrated circuit and the high-side integrated circuit; a through-silicon via formed in the high-side integrated circuit and the high voltage passivation layer where the through-silicon via electrically connects the first resistor to a drain terminal of the first LDMOS transistor formed on the low-side integrated circuit. In operation, the first LDMOS transistor and the first resistor form a level shifter circuit. The first LDMOS transistor receives a first signal relating to the high-side input signal and provides a first level-shifted signal to the latch circuit. The latch circuit generates a drive signal for driving the high-side driver.

According to another aspect of the present invention, a method for forming a three-dimensional gate driver integrated circuit includes providing a low-side integrated circuit having formed thereon a low-side driver and a first LDMOS transistor where the low-side integrated circuit receives a low-side input signal and a high-side input signal and provides a low-side output signal; providing a high-side integrated circuit having formed thereon a high-side driver, a first resistor, and a latch circuit where the high-side integrated circuit provides a high-side output signal; attaching the low-side integrated circuit to a package die paddle; attaching the high-side integrated circuit to the low-side integrated circuit through a high voltage passivation layer; etching a through-silicon via opening in the high-side integrated circuit and the high voltage passivation layer where the through-silicon via opening contacts the first resistor and extends to a drain terminal of the first LDMOS transistor formed on the low-side integrated circuit; forming a conductive material in the through-silicon via opening where the through-silicon via thus formed electrically connects the first resistor to the drain terminal of the first LDMOS transistor. In operation, the first LDMOS transistor and the first resistor form a level shifter circuit. The first LDMOS transistor receives a first signal relating to the high-side input signal and provides a first level-shifted signal to the latch circuit. The latch circuit generates a drive signal for driving the high-side driver.

The present invention is better understood upon consideration of the detailed description below and the accompanying drawings.

DETAILED DESCRIPTION OF THE PREFERRED EMBODIMENTS

In accordance with the principles of the present invention, a three-dimensional (3D) gate driver integrated circuit includes a high-side integrated circuit stacked on a low-side integrated circuit where the high-side integrated circuit and the low-side integrated circuit are interconnected using through-silicon vias (TSVs). As thus configured, the high-side integrated circuit and the low-side integrated circuit can be formed without termination regions and without buried layers. The 3D gate driver integrated circuit of the present invention improves ease of high voltage integration and improves the ruggedness and reliability of the gate driver integrated circuit.

In one embodiment, a 3D gate driver integrated circuit includes a low-side integrated circuit having the low-side driver and the level shifter LDMOS transistor formed thereon and a high-side integrated circuit having the high-side driver formed thereon. The substrate of the high-side integrated circuit is floating and no buried layer is needed as there is no need to provide isolation from the P-substrate of the low-side driver. The high-side driver formed on the high-side integrated circuit is interconnected to the level shifter LDMOS using TSVs. In one embodiment, wire bonds connect the low-side driver on the low-side integrated circuit and the high-side driver on the high-side integrated circuit to package leads of the 3D gate driver integrated circuit.

Figure 3:
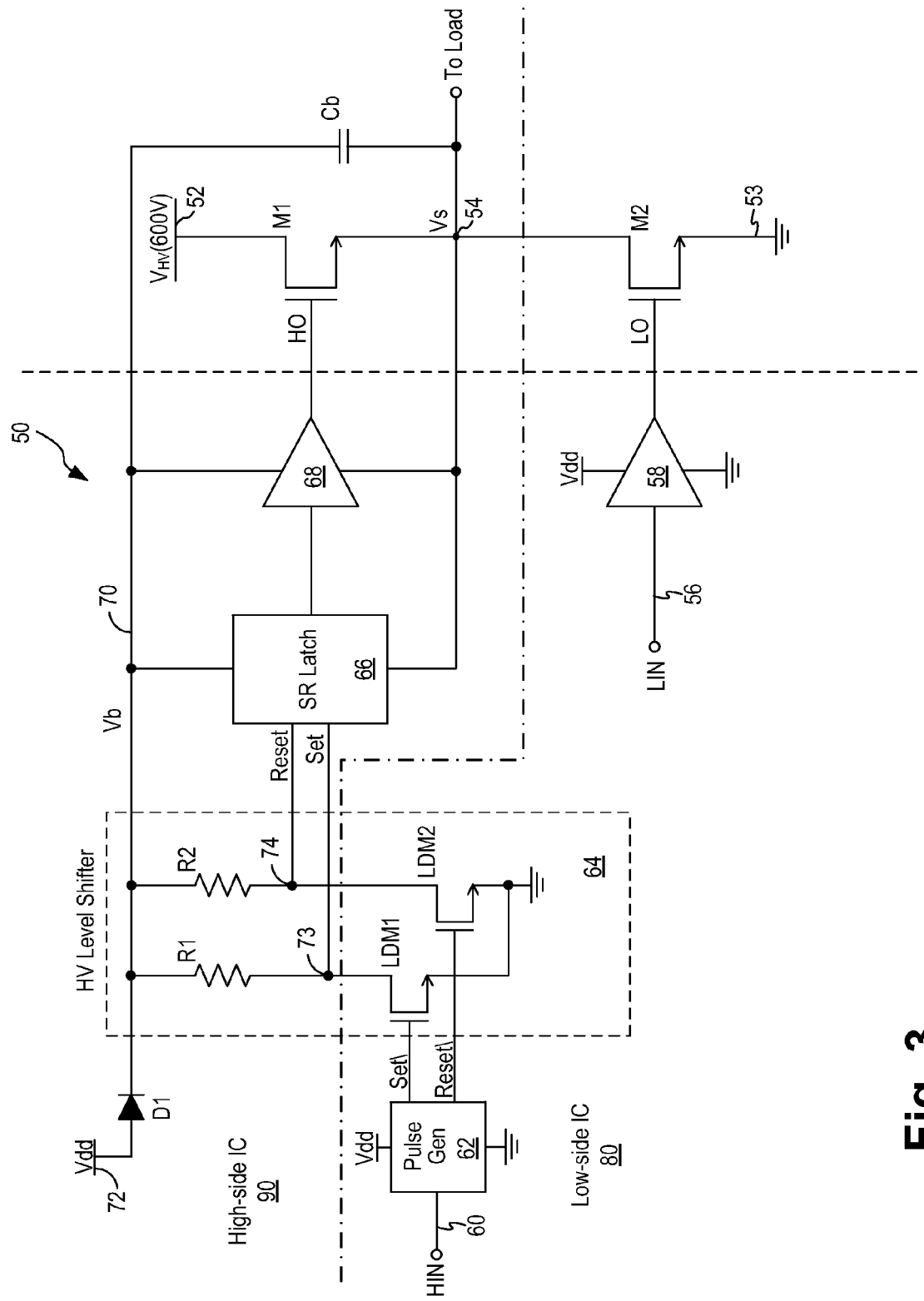
FIG. 3 is a circuit diagram of a high voltage gate driver circuit according to one embodiment of the present invention.

FIG. 3 is a circuit diagram of a high voltage gate driver circuit according to one embodiment of the present invention. Referring to FIG. 3, a high voltage gate driver circuit 50 is disposed to drive a pair of N-channel power MOSFETs M1 and M2 connected in series between a high supply voltage $V_{HV}$ (node 52) and the ground potential (node 53). In the present illustration, the high supply voltage $V_{HV}$ is 600V or above. The N-channel MOSFET M1 thus has to operate up to 600V. The pair of N-channel power MOSFETs M1 and M2, under the control of the high-side drive signal HO and the low-side drive signal LO, are alternately turned on and off to generate an output voltage signal Vs (node 54) to drive a load.

High voltage gate driver circuit 50 includes a high-side driver 68 for generating the high-side drive signal HO to drive power MOSFET M1 and a low-side driver 58 for generating the low-side drive signal LO to drive power MOSFET M2. The gate driver circuit 50 receives a logic supply voltage Vdd (node 72). The gate driver circuit 50 also receives a boost supply voltage Vb (node 70) generated from the logic supply voltage Vdd and a boost capacitor Cb. More specifically, the capacitor Cb is connected between the boost supply voltage node 70 and the output voltage Vs (node 54). A diode D1 is interposed between the logic supply voltage Vdd (node 72) and the top plate of the capacitor Cb (node 70). More specifically, the anode of diode D1 is connected to the logic supply voltage (node 72) and the cathode of diode D1 is connected to the top plate (node 70) of the capacitor Cb. Diode D1 functions to charge the boost capacitor Cb when MOSFET M2 is turned on and to provide reverse blocking when MOSFET M1 is turned on. That is, diode D1 allows current to flow from the logic supply voltage Vdd to charge up capacitor Cb in a forward bias direction when MOSFET M2 is turned on. However, diode D1 prevents current from flowing back to the logic supply voltage node from the capacitor Cb when MOSFET M1 is turned on.

In operation, when the low-side power MOSFET M2 is turned on and the output voltage signal Vs is driven to ground, capacitor Cb is charged up by the logic supply voltage Vdd and a capacitor voltage Vc develops across the capacitor Cb where the capacitor voltage Vc is approximately the logic supply voltage Vdd, such as around 25V when Vdd=25V. When the high-side power MOSFET M1 is turned on, the output voltage signal Vs is driven towards the high supply voltage $V_{HV}$ and the boost supply voltage Vb is boosted to a voltage value of Vs+Vc, such as around 600V+25V=625V when $V_{HV}$=600V. The high-side drive signal HO is driven to the boosted voltage Vb (e.g. 625V) when the high-side power MOSFET M1 is to be turned on. The output voltage signal Vs can thus be driven to the full value of the high supply voltage $V_{HV}$ (e.g. 600V).

The low-side driver 58 receives a low-side input signal LIN (node 56) which can be a CMOS or TTL compatible logic input signal. The input signal LIN is a pulse-width modulation (PWM) signal generated from a micro-controller. The low-side driver 58 converts the input signal LIN onto the low-side drive signal LO. The low-side driver 58 is powered by the logic supply voltage Vdd. On the other hand, the high-side driver 68 is driven by a high-side input signal HIN (node 60) which is also a PWM signal generated by a micro-controller. However, the high-side drive signal coupled to the high-side driver 68 is powered by the boost supply voltage Vb. More specifically, the high-side input signal HIN (node 60) is coupled to a pulse generator 62 which is powered by the logic supply voltage Vdd. The pulse generator 62 generates Set-bar (Set\) and Reset-bar (Reset\) signals for driving a high voltage level shifter circuit 64. The high voltage level shifter circuit 64 includes a pair of high voltage LDMOS transistors LDM1 and LDM2. LDMOS transistor LDM1 is controlled by the Set\ signal and is coupled through a resistor R1 to the boost supply voltage Vb (node 70). LDMOS transistor LDM2 is controlled by the Reset\ signal and is coupled through a resistor R2 to the boost supply voltage Vb (node 70). When one of LDMOS transistors LDM1 and LDM2 is turned on by the respective Set\ and Reset\ signals, the drain of the LDMOS transistor is pulled low and a voltage of Vb minus the voltage drop across the resistor R1 or R2 develops at the drain node 73 or 74.

Assuming resistors R1 and R2 have the same resistance value, the voltage at the drain nodes 73, 74 of the LDMOS transistors is given as $Vb-V_R$, where $V_R$ denotes the voltage drop across the resistor R1 or R2. When the high-side driver 68 is activated to a logical high level at the boost voltage Vb, the boost supply voltage Vb is elevated to Vs+Vc, such as 625V, and the drain nodes 73, 74 of the LDMOS transistors are driven to about 600, assuming voltage $V_R$ is about 25-30V. The high voltage LDMOS transistors LDM1 and LDM2 operate to level shift the Set\ and Reset\ signals generated by the pulse generator 62 to a voltage level needed for driving the high-side driver 68. The level-shifted Set and Reset Signals (nodes 73, 74) are coupled to drive a SR latch 66 which is powered by the boost supply voltage Vb. SR latch 66 generates the pulse signal for driving high-side driver 68.

In the present embodiment, the high voltage gate driver circuit 50 employs two level shifting LDMOS transistors to generate the level-shifted Set and Reset signals for driving the high-side driver 68. In other embodiments, a single level-shifting LDMOS transistor can be used to convert the high-side input signal HIN to a drive signal for the high-side driver 68. The use of two level-shifting LDMOS transistors provides advantages in matching the turning on and off of the low-side and high-side drive signals.

The high voltage gate driver circuit 50 may further include other circuitry such as UVLO (undervoltage-lockout) circuits associated with the high-side driver and low-side driver to detect an undervoltage condition and to shut down the gate driver circuit should the supply voltages fall below the operational range.

As thus configured, the high voltage gate driver circuit 50 includes circuit elements that are operated at a high voltage, such as a voltage value close to the high supply voltage $V_{HV}$, and circuit elements that are operated at the logic supply voltage Vdd. The high voltage gate driver circuit 50 thus includes a high voltage circuit region above the dot-dash line where a high voltage floating tub is used to house the low voltage circuits including resistors R1, R2, the SR latch 66 and the high-side driver 68. In the present description, the term "high voltage circuit region" refers to a circuit region of low voltage circuits that are sitting inside a high voltage floating tub.

Figure 1:
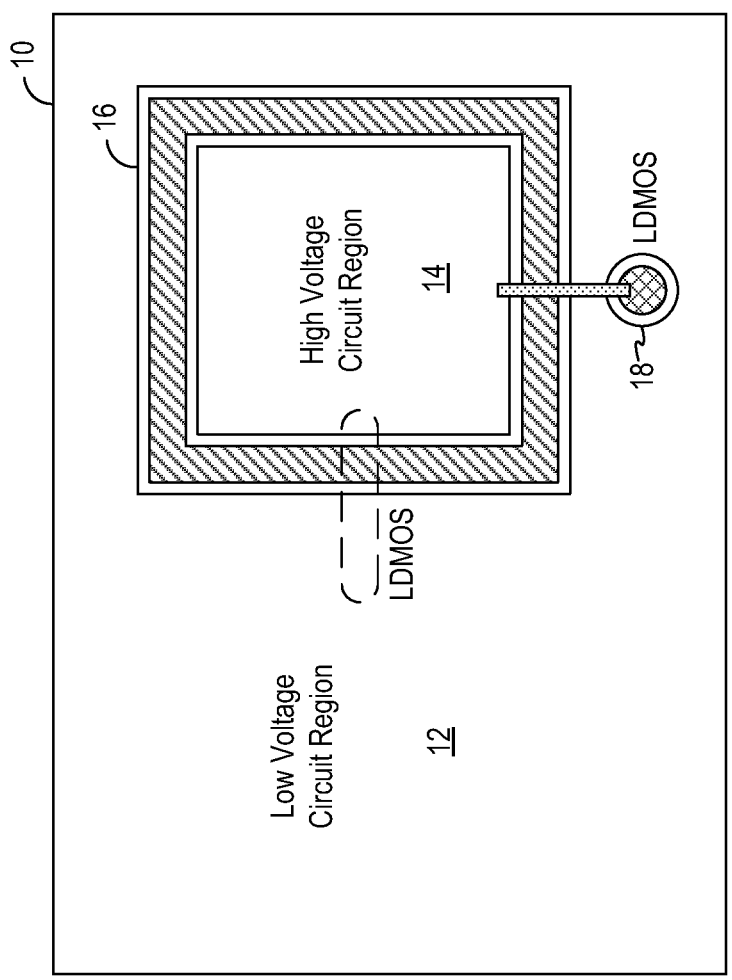
FIG. 1 is a top view of a conventional high voltage gate driver integrated circuit.
Figure 2:
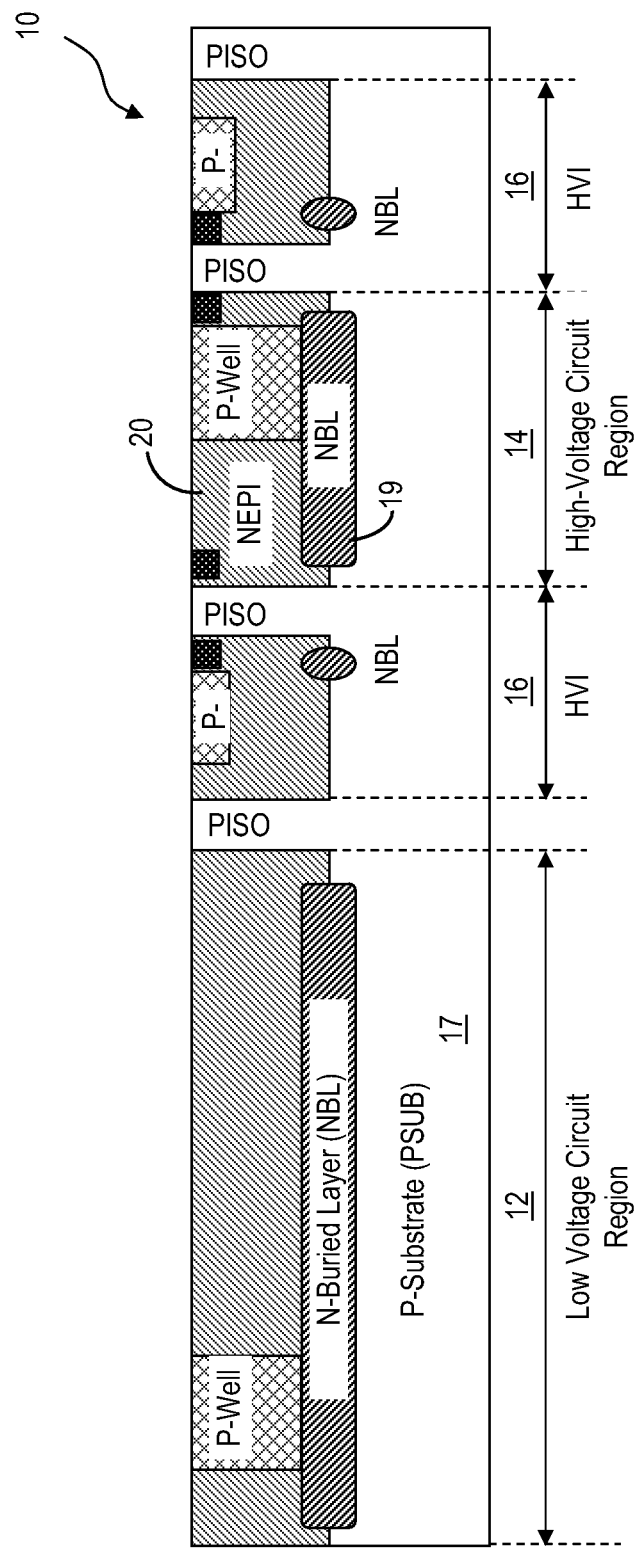
FIG. 2 is a cross-sectional view of the conventional high voltage gate driver integrated circuit of FIG. 1.

The high voltage gate driver circuit 50 further includes a low voltage circuit region below the dot-dash line for housing the pulse generator 62, the LDMOS transistors LDM1 and LDM2 and the low-side driver 58. In conventional implementations such as that shown in FIGS. 1 and 2, the high voltage floating tub is formed beside the low voltage circuit region with a large junction termination region surrounding the high voltage floating tub. Also, when the substrate is a P-type substrate, the high voltage floating tub may be formed in an N-type epitaxial layer or a P-type epitaxial layer formed over an N-type buried layer. When a P-type epitaxial layer is used, an N-type isolation structure around the N-buried layer is used to isolate the high voltage floating tub from the P-substrate. The junction termination region increases the size of the gate driver circuit when formed as a monolithic integrated circuit and the buried layer increases manufacturing cost.

According to embodiments of the present invention, the high voltage gate driver circuit 50 is formed using a high-side integrated circuit 90 (above the dot-dash line) and a low-side integrated circuit 80 (below the dot-dash line). Thus, the resistors R1, R2, the SR latch 66, and the high-side driver 68 are formed on the high-side IC 90 while the pulse generator 62, the LDMOS transistors LDM1 and LDM2 and the low-side driver 58 are formed on the low-side IC 80. The high-side integrated circuit is stacked on the low-side integrated circuit to form a three-dimensional gate driver integrated circuit. By forming the high voltage circuit region and the low voltage circuit region into separate integrated circuits, junction termination or isolation structures are eliminated. Furthermore, although the high voltage circuit region is formed in a high voltage floating tub connected to the boost supply voltage Vb, such as the 625V boost supply voltage Vb, the high voltage circuit region houses low voltage circuits that have a limited operating voltage, such as a 25-30V circuit, where the operating voltage is determined by the boost supply voltage Vb to Vs voltage which is also the voltage Vc across the boost capacitor Cb. Therefore, the drain of the LDMOS transistors (nodes 73 and 74) and the high-side driver 68 has an operating voltage range about the voltage Vc of the boost capacitor Cb even while all the circuit nodes are sitting on the boost supply voltage Vb. Thus, the isolation for the LDMOS transistor drain regions that are electrically connected to the high voltage integrated circuit 90 becomes simpler as the drain isolation only needs to withstand the voltage difference of Vc.

Figure 4:
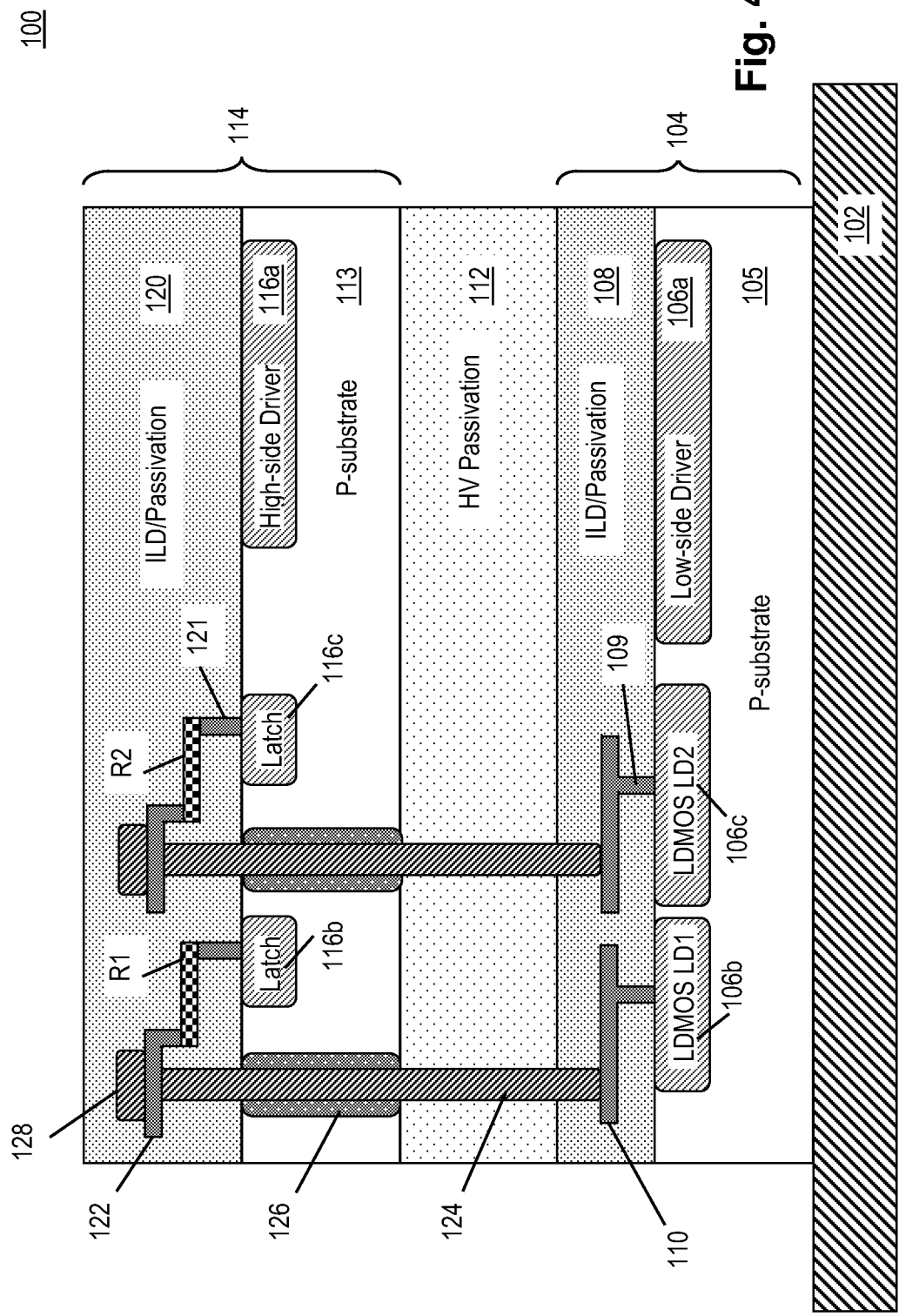
FIG. 4 is a cross-sectional view of a 3D gate driver integrated circuit according to one embodiment of the present invention.

FIG. 4 is a cross-sectional view of a 3D gate driver integrated circuit according to one embodiment of the present invention. Referring to FIG. 4, a 3D gate driver integrated circuit 100 includes a low-side integrated circuit 104 attached to a package die paddle 102. The low-side integrated circuit 104 is formed on a P-type substrate 105 and includes N-tubs 106a to 106c in which low voltage circuitry associated with the low-side integrated circuit are formed. In particular, the low-side driver may be formed in an N-tub 106a. Other control circuitry, including the UVLO circuits, may also be formed in the N-tub 106a. The level shifting LDMOS transistors LD1 is formed in an N-tub 106b and the level shifting LDMOS transistor LD2 is formed in an N-tub 106c. The low-side integrated circuit 104 does not include any high voltage circuit elements except for the drain nodes of the level-shifting LDMOS transistors, the amount of isolation structures that are needed is minimized. Furthermore, N-tubs 106a-c can be formed without the use of buried layers. In some cases, the low-side integrated circuit 104 can also be formed without the use of an N-type epitaxial layer.

The low-side integrated circuit 104 includes conductive landing pads 110 for connecting the drain terminal of the LDMOS transistors to the high-side integrated circuit 114. The landing pads 110 are formed on an inter-layer dielectric layer 108 and connected to the drain terminal of the respective LDMOS transistors LD1 and LD2 through vias 109. The low-side integrated circuit 104 is then passivated by a passivation layer 108. In the present illustration, the inter-layer dielectric layer and the passivation layer are shown collectively as layer 108. It is understood that layer 108 includes different insulating dielectric and passivation layers.

The high-side integrated circuit 114 is formed on a P-type substrate 113 and includes N-tubs 116a to 116c in which low voltage circuitry of the high-side integrated circuit are formed. The P-type substrate 113 is connected to the output voltage Vs node so that the substrate voltage switches between ground and the high supply voltage $V_{HV}$. In the present description, the P-type substrate 113 is sometimes referred to as being "floating" which refers to the fact that the substrate 113 is not connected to a fixed voltage potential but to a voltage value that varies between ground and the high supply voltage $V_{HV}$.

In particular, the high-side driver may be formed in an N-tub 116a. Other control circuitry, including the UVLO circuits, may also be formed in the N-tub 116a. The SR latch circuit is formed in N-tub 116b and 116c. Because the high-side integrated circuit 114 is formed as a standalone integrated circuit, the high-side integrated circuit 114 does not need any high voltage isolation (such as 625V isolation) since the high-side P-substrate 113 is connected to the output voltage Vs which serves as the ground reference for the high-side circuits. Furthermore, because the P-substrate 113 is "floating" and because the high-side integrated circuit 114 experiences only a small voltage swing (30V) even though the circuitry are sitting on the high supply voltage (≈600V), N-tubs 116a-c can be formed without the use of buried layers. In some cases, the high-side integrated circuit 114 can also be formed without the use of an N-type epitaxial layer.

Resistors R1 and R2 for the level shifter circuit are formed in the high-side integrated circuit 114 and insulated from the P-substrate 113 by an inter-layer dielectric layer 120. The resistors R1 and R2 are connected to the SR latch circuit through vias 121. The high-side integrated circuit 114 is then passivated by a passivation layer 120. In the present illustration, the inter-layer dielectric layer and the passivation layer are shown collectively as layer 120. It is understood that layer 120 includes different insulating dielectric and passivation layers.

In the present embodiment, the high-side integrated circuit 114 receives two input signals from the low-side integrated circuit 104. More specifically, the drains of the level shifting LDMOS transistors are to be connected to respective resistors R1 and R2. In embodiments of the present invention, the low-side integrated circuit 104 is coated with a high voltage passivation layer 112 and the high-side integrated circuit 114 is die-attached to the high voltage passivation layer 112. Then the through-silicon via (TSV) structure is used to form the electrical connection between the LDMOS transistors and the resistors. In the present embodiment, two TSV structures 124 are formed to connect metal pads 122 connecting to resistors R1 and R2 to the landing pads 110 connecting to the drain of the LDMOS transistors. The TSV structures 124 include a TSV dielectric layer 126 formed along the sidewall of the via opening in the P-substrate 113. In this manner, the TSV dielectric layer 126 provides isolation of the conductive material in the TSV from the P-type substrate 113. The TSV dielectric layer 126 only needs to be a low voltage isolation material, such as 30V-50V. This is because there is only a small voltage difference (e.g., 30V) between the voltage of the TSV node and the P-type substrate 113, even though both are sitting on the high supply voltage value (600V). The TSV structures 124 may be covered by a cap layer 128.

As thus formed, a 3D gate driver integrated circuit is formed where the high voltage circuit region and the low voltage circuit region are formed in separate integrated circuits and are stacked and interconnected through TSVs. Connections of the 3D gate driver integrated circuit to external package leads can be accomplished through wire bonding to the high-side integrated circuit and the low-side integrated circuit (not shown). The external connections can include the high-side and low-side input logic signals HIN, LIN, the logic supply voltage Vdd, the boost supply voltage Vb, and the high-side and low-side output signals HO and LO.

In the embodiment shown in FIG. 4, two level-shifting LDMOS transistors are used to level-shift the Set and Reset signals through resistors R1 and R2 to the high-side driver. In other embodiments, the high voltage gate driver circuit may be implemented using only one level-shifting LDMOS transistor and one corresponding resistor. The use of two level-shifting LDMOS transistors in FIG. 4 is illustrative only.

The advantages of the 3D gate driver integrated circuit of the present invention are numerous. First, the 3D gate driver integrated circuit is scalable and can operate at a high supply voltage of 600-1200V. Second, the 3D stacking architecture reduces chip footprint versus one-dimensional planar gate driver IC architecture. Third, by separating the high-side and low-side circuit regions into separate integrated circuits, there is no need for a high voltage termination area, buried layer, or epitaxial layers. The size of the integrated circuit can be reduced as well as reducing the manufacturing cost. Fourth, because the N-buried layer is removed, delays in the driver circuit are reduced as the N-tub capacitance is reduced. Fifth, by separating the high voltage circuit region and the low voltage circuit region into separate integrated circuit chips, the ruggedness of the gate driver circuit is improved as the gate driver is immune to latch-up. Finally, it is easier to pass reliability tests such as HTRB (High Temperature Reverse Bias) since the high-side driver N-tubs are physically separated from low-side driver N-tubs.

Figure 5:
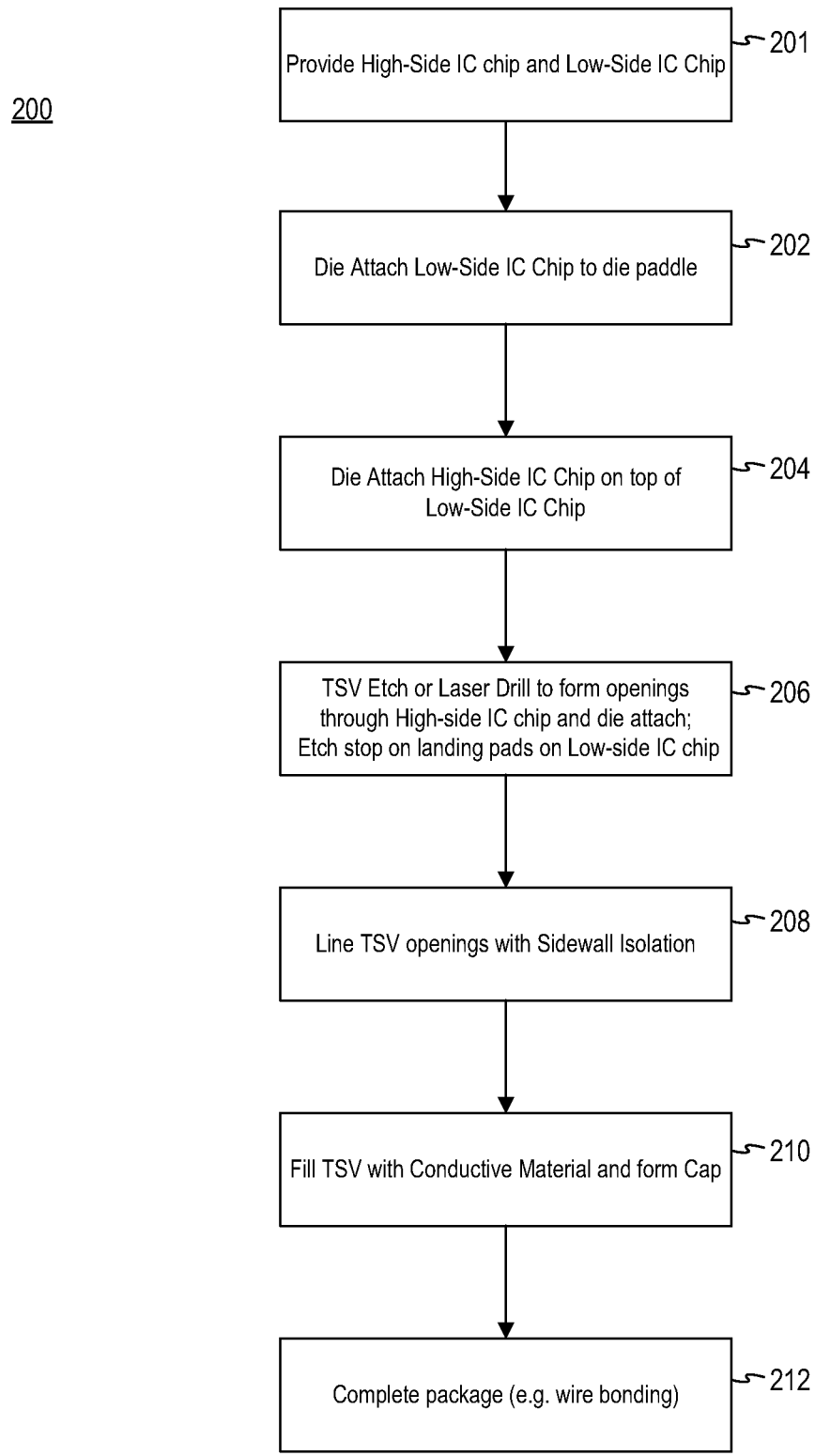
FIG. 5 is a flowchart illustrating the method for forming a 3D gate driver integrated circuit according to one embodiment of the present invention.

FIG. 5 is a flowchart illustrating the method for forming a 3D gate driver integrated circuit according to one embodiment of the present invention. Referring to FIG. 5, a method 200 for forming a 3D gate driver integrated circuit starts by providing a high-side integrated circuit (IC) chip and a low-side integrated circuit (IC) chip (step 201). The low-side IC chip includes the low voltage circuits such as the low-side driver, control circuitry and the level shifting LDMOS transistors. The high-side IC chip includes the high voltage circuits such as the high-side driver, the RS latch circuit and the resistors for the level shifter circuit. The method 200 proceeds by attaching the low-side IC chip to a package die paddle, such as using a die attach (step 202). Then the high-side IC chip is attached to the top of the low-side IC chip, such as using a die attach (step 204).

In some embodiments, the low-side IC chip has formed thereon a high voltage passivation layer and the high-side IC chip is attached to the top of the high voltage passivation layer. In other embodiments, a high voltage passivation layer can be formed on the backside of the high-side integrated circuit and then the high-side integrated circuit with the high voltage passivation layer is attached to the low-side integrated circuit and/or discrete LDMOS transistors.

Then, a through-silicon via (TSV) etch or laser drill process is performed to form openings through the high-side IC chip, the die attach, and the passivation layer on the low-side IC chip (step 206). The landing pads on the low-side IC chip serve as the etch stop for the TSV etch. The TSV openings are then lined with sidewall isolation (step 208). The sidewall isolation only needs to be of a low voltage rating, such as 30-50V, as the voltage difference between the TSV node and the high-side IC chip substrate is only 30-50V.

The TSV openings are then filled with a conductive material and each filled via is sealed by a cap (step 210). Then, wire bonding is performed to form the connections of the 3D gate driver integrated circuit to external package leads (step 212).

Figure 6:
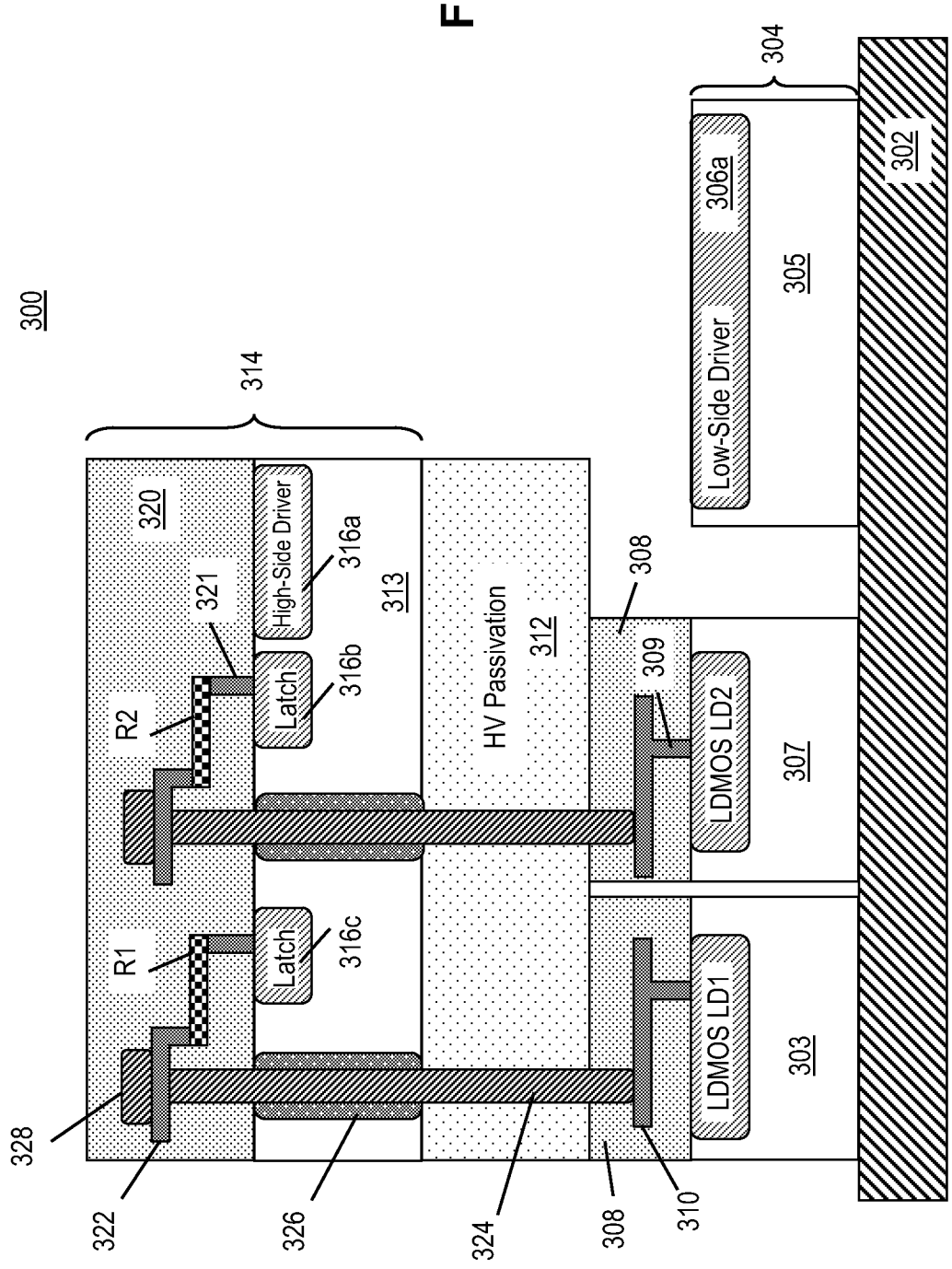
FIG. 6 is a cross-sectional view of a 3D gate driver integrated circuit according to an alternate embodiment of the present invention.

In the embodiments described above, the low-side integrated circuit in the 3D gate driver integrated circuit is formed as a monolithic integrated circuit including the low-side driver circuitry and the LDMOS transistors. In other embodiments, the low-side integrated circuit can be formed as separate integrated circuit chips using discrete LDMOS transistors. FIG. 6 is a cross-sectional view of a 3D gate driver integrated circuit according to an alternate embodiment of the present invention. Referring to FIG. 6, the 3D gate driver integrated circuit 300 includes a low-side integrated circuit 304 having formed thereon the low-side driver and other control circuitry, such as the UVLO circuit. The low-side integrated circuit 304 may be formed on a P-type substrate 305 with an N-tub 306a for the low voltage circuits. The low-side integrated circuit 304 is die attached to a die paddle 302.

The 3D gate driver integrated circuit 300 further includes a pair of bottom-source discrete LDMOS transistor devices 303 and 307. Discrete LDMOS transistors are commercially available. In some embodiments, a single integrated circuit may include dual discrete bottom-source LDMOS transistors. Alternately, a pair of bottom-source discrete trench DMOS transistor devices can be used. In embodiments of the present invention, landing pads 310 are formed on an inter-layer dielectric layer 308 to make electrical contact with the drain terminals of the discrete LDMOS devices 303 and 307 through vias 309. Each discrete LDMOS devices 303, 307 are then covered by a passivation layer 308. In the present illustration, the inter-layer dielectric layer and the passivation layer are collectively referred to as layer 308. A high voltage passivation layer 312 is then formed over the discrete LDMOS devices 303, 307. The high-side integrated circuit 314 is then attached to the high voltage passivation layer 312. Through-silicon via structures 324 are then formed to realize the electrical connection between the resistors R1 and R2 in the high-side integrated circuit 314 and the drain terminals of the discrete LDMOS transistors 303, 307, in the same manner as described above with reference to FIG. 4.

Figure 7:
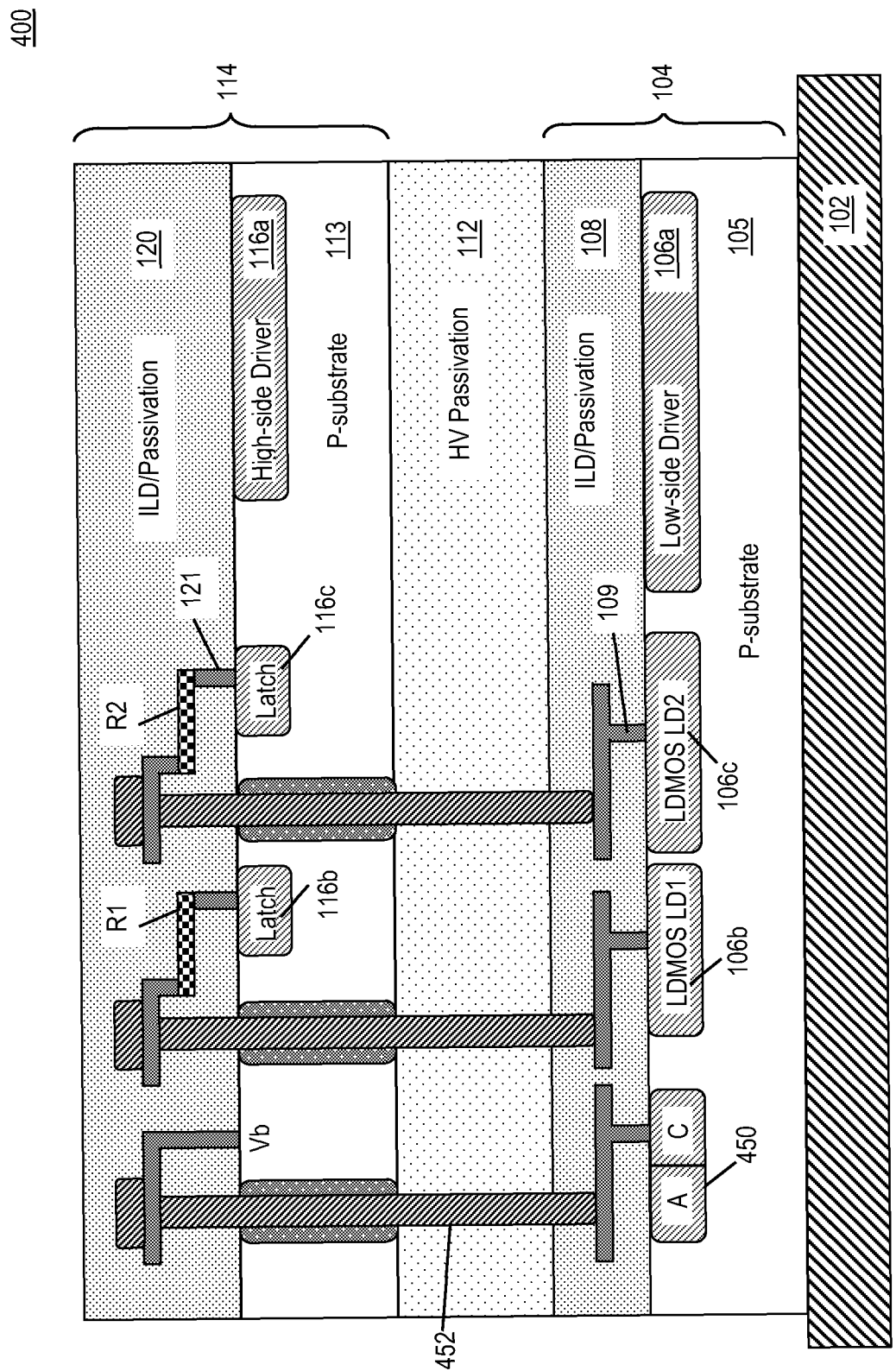
FIG. 7 is a cross-sectional view of a 3D gate driver integrated circuit according to a second alternate embodiment of the present invention.

In embodiments of the present invention, the 3D gate driver integrated circuit includes the boost diode D1 (FIG. 3) integrated with the low-side integrated circuit. FIG. 7 is a cross-sectional view of a 3D gate driver integrated circuit according to a second alternate embodiment of the present invention. Referring to FIG. 7, in the present embodiment, a 3D gate driver integrated circuit 400 includes a boost diode 450 formed on the P-substrate 105 of the low-side integrated circuit 104. The cathode terminal of the boost diode 450 is connected through a TSV 452 to the boost supply voltage Vb node on the high-side integrated circuit 114. The anode terminal of the boost diode 450 may be connected through a bond wire or a metal bus to the logic supply voltage Vdd node.

Figure 8:
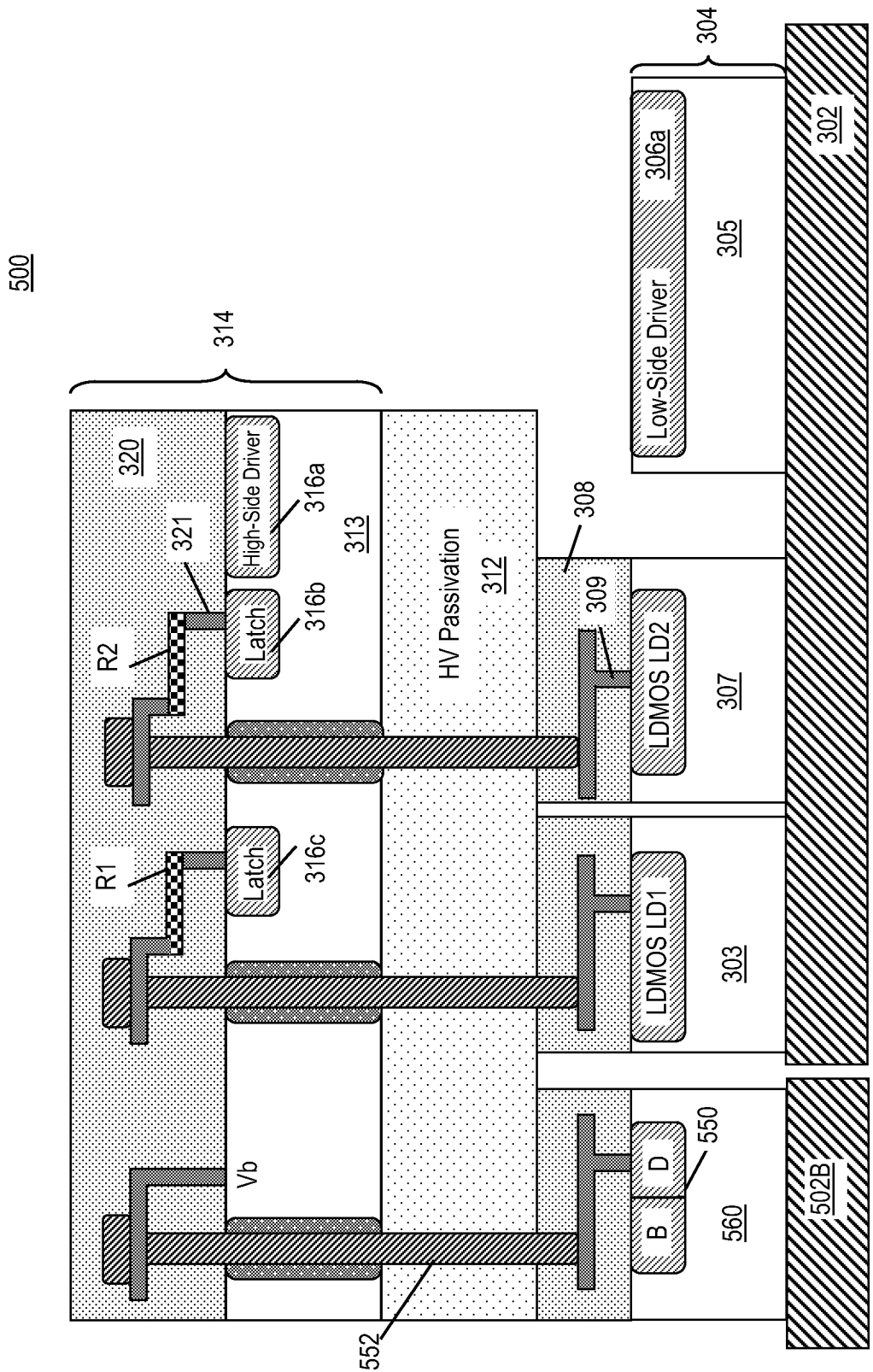
FIG. 8 is a cross-sectional view of a 3D gate driver integrated circuit according to a third alternate embodiment of the present invention.

FIG. 8 is a cross-sectional view of a 3D gate driver integrated circuit according to a third alternate embodiment of the present invention. Referring to FIG. 8, in the present embodiment, a 3D gate driver integrated circuit 500 includes a boost diode 550 formed as a discrete N-type LDMOS transistor device 560. More specifically, the gate and source terminals of the discrete LDMOS transistor device 560 are shorted together and also shorted to the P-type body. The N-type drain diffusion and the P-type body of the transistor form a body diode used as the boost diode D1. The cathode terminal (D) of the boost diode 550 is connected through a TSV 552 to the boost supply voltage Vb node on the high-side integrated circuit 314. The anode terminal of the boost diode 550, the body (B) of the LDMOS transistor, is connected through a die paddle portion 502b which is connected to the logic supply voltage Vdd node. The die paddle portion 302 for the LDMOS transistor devices 303, 307 and the low-side driver 305 are connected to the ground potential.

In other embodiments, a discrete P-type LDMOS transistor device can be used as the boost diode D1. In that case, the N-type body, with the source and gate terminals shorted together, is the cathode of the diode and the P-type drain diffusion is the anode of the diode.

Figure 9:
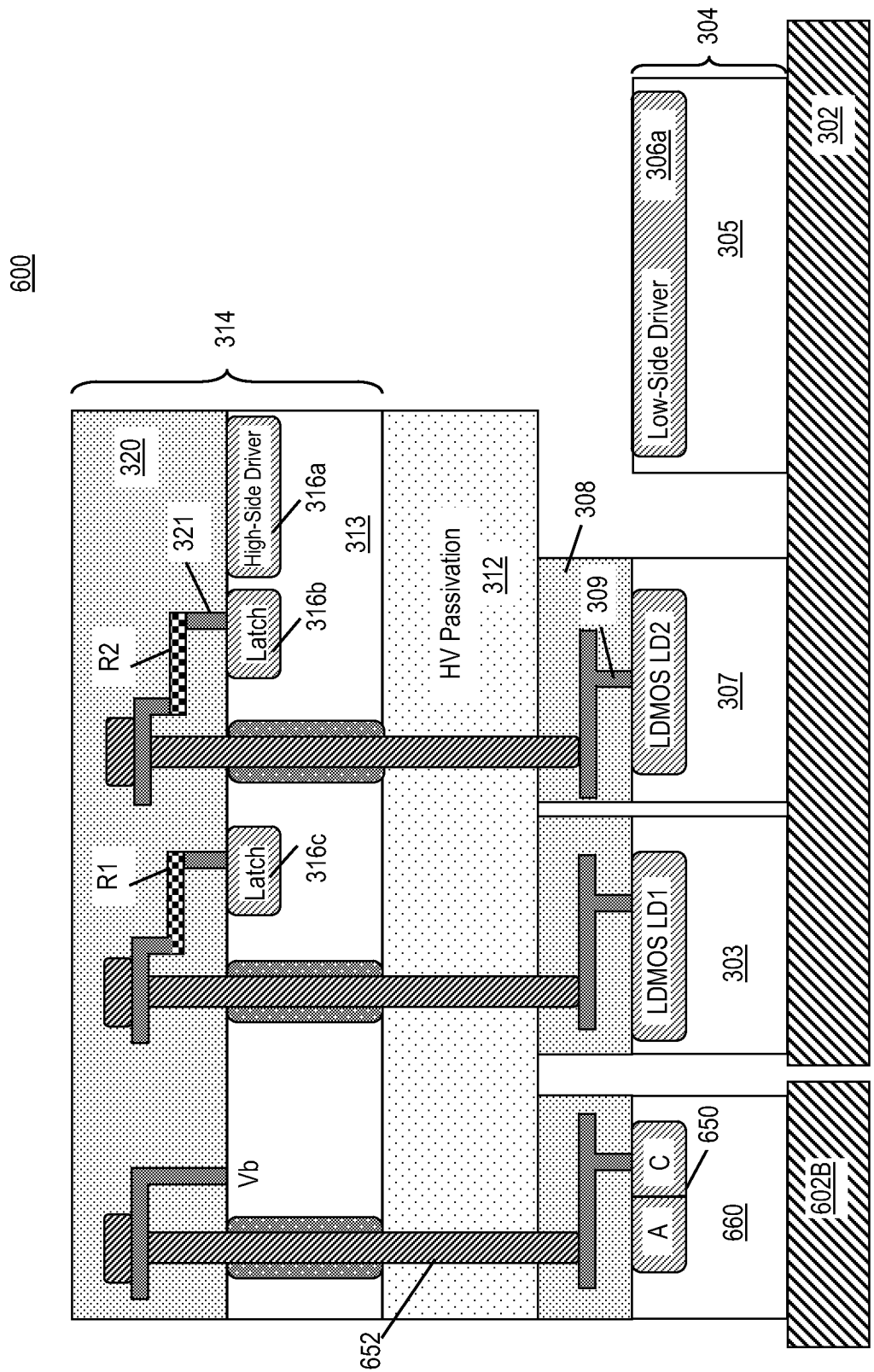
FIG. 9 is a cross-sectional view of a 3D gate driver integrated circuit according to a fourth alternate embodiment of the present invention.

FIG. 9 is a cross-sectional view of a 3D gate driver integrated circuit according to a fourth alternate embodiment of the present invention. Referring to FIG. 9, in the present embodiment, a 3D gate driver integrated circuit 600 includes a boost diode 650 formed as a discrete Schottky diode device 660. The cathode terminal of the boost diode 650 is connected through a TSV 652 to the boost supply voltage Vb node on the high-side integrated circuit 314. The anode terminal of the boost diode 650 is connected through a die paddle portion 602b which is connected to the logic supply voltage Vdd node. The die paddle portion 302 for the LDMOS transistor devices 303, 307 and the low-side driver 305 are connected to the ground potential.

In embodiments of the present invention, the boost diode can be formed using a discrete LDMOS transistor or a discrete Schottky diode on an integrated circuit separate from the low-side integrated circuit including the low-side driver and the level-shifting LDMOS transistors. That is, referring to FIG. 7, instead of integrating the boost diode 450 onto the same substrate of the low-side integrated circuit 104, the boost diode can be provided as discrete devices as shown in FIGS. 8 and 9.

Figure 10:
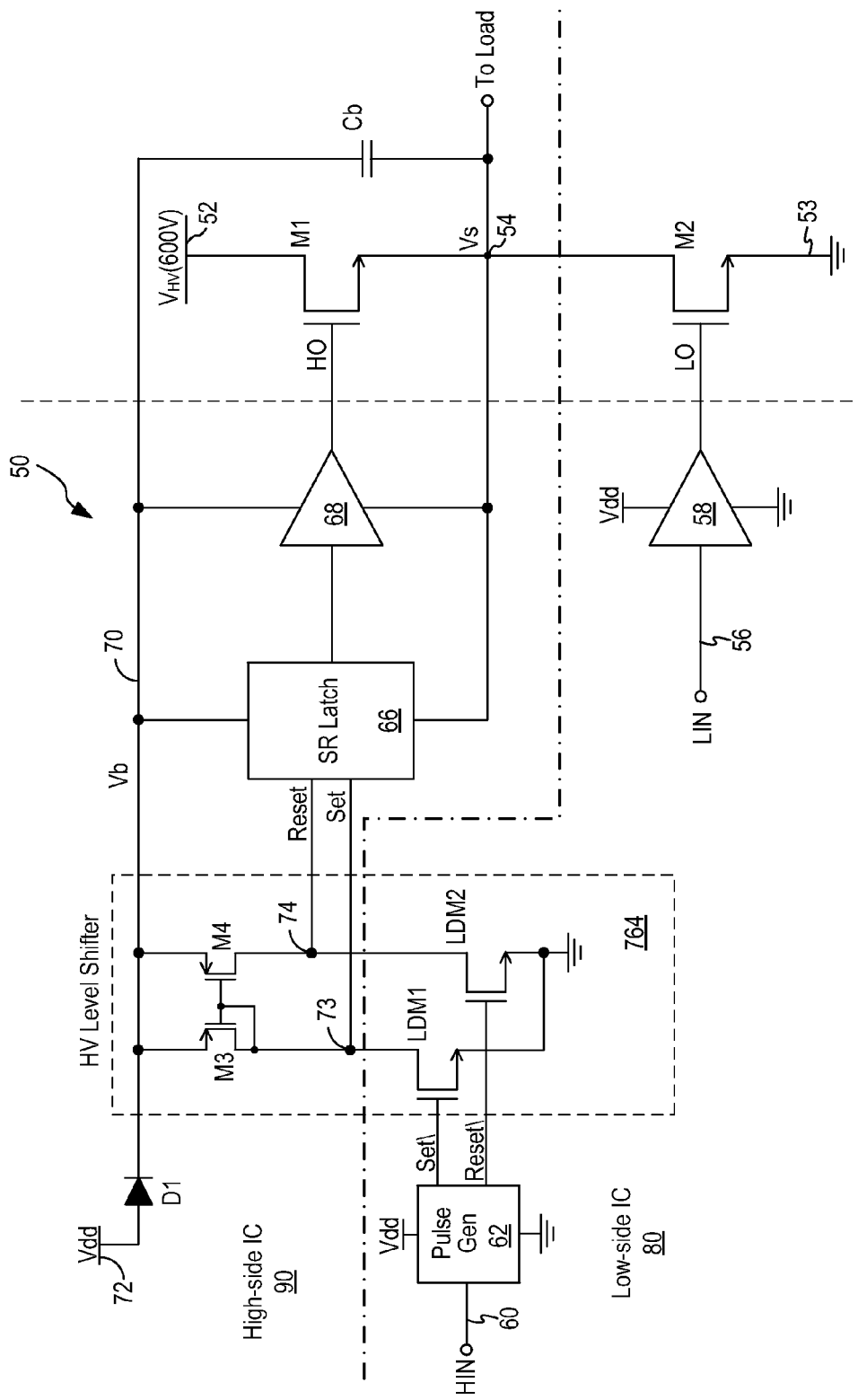
FIG. 10 is a circuit diagram of a high voltage gate driver circuit according to an alternate embodiment of the present invention.

In the above-described embodiments, the level shifter circuit is formed using resistors R1 and R2 as a passive load to the LDMOS transistors LDM1 and LDM2. In other embodiments, the level shifter circuit may be implemented using other loading circuit, including passive load or active load, to transfer a signal from the low-side integrated circuit to a voltage value suitable for the high-side integrated circuit, that is a voltage between the boost supply voltage Vb and the output voltage Vs. In one embodiment, the level shifter circuit is implemented using a current mirror as an active load to the LDMOS transistors LDM1 and LDM2. FIG. 10 is a circuit diagram of a high voltage gate driver circuit according to an alternate embodiment of the present invention. Like elements in FIGS. 3 and 10 are given like reference numerals to simplify the description. Referring to FIG. 10, the high voltage level shifter circuit 764 is formed using a current mirror circuit as an active load to the LDMOS transistors LDM1 and LDM2. The current mirror circuit is formed by a diode-connected PMOS transistor M3 acting as a current mirror and a PMOS transistor M4 acting as a current source. The gate terminals of the PMOS transistors M3 and M4 are connected together. As thus configured, the current mirror circuit of PMOS transistors M3 and M4 provides active loading to the LDMOS transistors LDM1 and LDM2. When implemented in the 3D gate driver integrated circuit, the PMOS transistors of the current mirror circuit is formed on the high-side integrated circuit and TSVs are formed to connect the drain nodes of the LDMOS transistor devices in the low-side integrated circuit to the drain terminals of the PMOS transistors M3 and M4 of the current mirror circuit.

In other embodiments, the level shifter circuit is implemented using a latch circuit as the active load and the drain terminals (nodes 73, 74) of the LDMOS transistors are clamped to the output voltage Vs to prevent the drain nodes from dropping below voltage Vs. Other active or passive load circuits can be used to connect to the LDMOS transistors in the level shifter circuit. The use of resistors, PMOS current mirror, and latch circuit are exemplary only and not intended to be limiting.

The above detailed descriptions are provided to illustrate specific embodiments of the present invention and are not intended to be limiting. Numerous modifications and variations within the scope of the present invention are possible. The present invention is defined by the appended claims.

I claim:

1. A three-dimensional gate driver integrated circuit, comprising:
 a low-side integrated circuit having formed thereon a low-side driver and a first LDMOS (lateral double-diffused metal-oxide-semiconductor) transistor, the low-side integrated circuit receiving a low-side input signal and a high-side input signal and providing a low-side output signal;
 a high-side integrated circuit having formed thereon a high-side driver, a first load circuit, and a latch circuit, the high-side integrated circuit providing a high-side output signal;
 a high voltage passivation layer formed between the low-side integrated circuit and the high-side integrated circuit; and
 a through-silicon via formed in the high-side integrated circuit and the high voltage passivation layer, the through-silicon via electrically connecting the first load circuit to a drain terminal of the first LDMOS transistor formed on the low-side integrated circuit,
 wherein the first LDMOS transistor and the first load circuit form a level shifter circuit, the first LDMOS transistor receiving a first signal relating to the high-side input signal and providing a first level-shifted signal to the latch circuit, the latch circuit generating a drive signal for driving the high-side driver.

2. The three-dimensional gate driver integrated circuit of claim 1, wherein the first load circuit comprises one of a resistor.

3. The three-dimensional gate driver integrated circuit of claim 1, wherein the low-side integrated circuit further includes a second LDMOS transistor formed thereon and the high-side integrated circuit further includes a second load circuit, a second through-silicon via formed in the high-side integrated circuit and the high voltage passivation layer to electrically connect the second load circuit to a drain terminal of the second LDMOS transistor formed on the low-side integrated circuit, the second LDMOS transistor and the second load circuit forming a level shifter circuit, the second LDMOS transistor receiving a second signal relating to the high-side input signal and providing a second level-shifted signal to the latch circuit, the latch circuit generating a drive signal based on the first and second level-shifted signals for driving the high-side driver.

4. The three-dimensional gate driver integrated circuit of claim 3, wherein the first load circuit and the second load circuit comprise one of first and second resistors, a current mirror circuit, or a latch circuit.

5. The three-dimensional gate driver integrated circuit of claim 1, wherein the through-silicon via comprises a sidewall dielectric layer at a portion of the via formed through the high-side integrated circuit.

6. The three-dimensional gate driver integrated circuit of claim 5, wherein the sidewall dielectric layer is a low voltage dielectric layer.

7. The three-dimensional gate driver integrated circuit of claim 1, wherein the low-side integrated circuit further comprises a landing pad electrically connected to the drain terminal of the first LDMOS transistor, the landing pad being used as an etch stop for the through-silicon via.

8. The three-dimensional gate driver integrated circuit of claim 1, wherein the high-side integrated circuit is formed in a substrate of a first conductivity type that is electrically connected to an output voltage of a pair of power MOSFETs driven by the high-side output signal and the low-side output signal, the high-side driver being formed in a tub of a second conductivity type formed in the substrate without a buried layer.

9. The three-dimensional gate driver integrated circuit of claim 1, wherein the low-side integrated circuit is formed on a substrate of a first conductivity type and the low-side driver is formed in a tub of a second conductivity type formed in the substrate without a buried layer.

10. The three-dimensional gate driver integrated circuit of claim 1, wherein the low-side integrated circuit comprises a first integrated circuit chip having formed thereon the low-side driver and a second integrated circuit chip being a first discrete LDMOS transistor, the through-silicon via electrically connecting the first load circuit to a drain terminal of the first discrete LDMOS transistor.

11. The three-dimensional gate driver integrated circuit of claim 10, wherein the high voltage passivation layer is formed over the first discrete LDMOS transistor only and the high-side integrated circuit is attached to the high voltage passivation layer formed over the first discrete LDMOS transistor.

12. The three-dimensional gate driver integrated circuit of claim 10, wherein the high voltage passivation layer is formed on a backside of the high-side integrated circuit and the high-side integrated circuit with the high voltage passivation layer is attached to a top side of at least the first discrete LDMOS transistor.

13. The three-dimensional gate driver integrated circuit of claim 1, further comprising:
a boost diode formed on the low-side integrated circuit, a cathode terminal of the boost diode being connected by a third through-silicon via formed in the high-side integrated circuit and the high voltage passivation layer to a boost supply voltage node on the high-side integrated circuit.

14. The three-dimensional gate driver integrated circuit of claim 1, further comprising:
a boost diode formed as a body diode of a discrete N-type LDMOS transistor device, the source, the gate and the body terminals of the discrete LDMOS transistor device being electrically connected together, the drain terminal of the discrete LDMOS transistor device being connected by a third through-silicon via formed in the high-side integrated circuit and the high voltage passivation layer to a boost supply voltage node on the high-side integrated circuit, the discrete N-type LDMOS transistor device being electrically connected to a first die paddle portion electrically isolated from a second die paddle portion on which the low-side integrated circuit is connected.

15. The three-dimensional gate driver integrated circuit of claim 1, further comprising:
a boost diode formed as a discrete Schottky diode device, the cathode terminal of the discrete Schottky diode device being connected by a third through-silicon via formed in the high-side integrated circuit and the high voltage passivation layer to a boost supply voltage node on the high-side integrated circuit, the discrete Schottky diode device being electrically connected to a first die paddle portion electrically isolated from a second die paddle portion on which the low-side integrated circuit is connected.

* * * * *